(12) United States Patent
Narendra et al.

(10) Patent No.: US 6,496,040 B1
(45) Date of Patent: Dec. 17, 2002

(54) TRADING OFF GATE DELAY VERSUS LEAKAGE CURRENT USING DEVICE STACK EFFECT

(75) Inventors: Siva G. Narendra, Beaverton, OR (US); Yibin Ye, Hillsboro, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/823,633

(22) Filed: Mar. 30, 2001

(51) Int. Cl.[7] .............................................. H01L 25/00
(52) U.S. Cl. ...................... 326/102; 326/101; 326/112
(58) Field of Search ................................ 326/112, 119, 326/121, 101, 102

(56) References Cited

U.S. PATENT DOCUMENTS 5,973,533 A * 10/1999 Nagaoka ...................... 327/263
6,288,573 B1 * 9/2001 Tanizaki et al. ............. 326/120

* cited by examiner

*Primary Examiner*—Michael Tokar
*Assistant Examiner*—Anh Q. Tran
(74) *Attorney, Agent, or Firm*—Fish & Richardson P.C.

(57) ABSTRACT

A stack device is provided to obtain a stack effect. The stack device includes at least first and second active components. The first and second active components have first and second device widths, respectively. The first and second device widths are then selected to provide a desired leakage current and gate delay time for the stack device. The selection includes adjusting the first and second device widths while keeping a sum of the device widths constant.

22 Claims, 7 Drawing Sheets

TRADING OFF GATE DELAY VERSUS LEAKAGE CURRENT USING DEVICE STACK EFFECT

BACKGROUND

This specification relates to a forced stack device, and more particularly to trading off gate delay versus leakage current by adjusting device widths of such a forced stack device.

Metal oxide semiconductor (MOS) device technologies may scale the MOS transistors to increasingly smaller dimensions. This may result in better device performance. The ability to improve performance while decreasing power consumption has made MOS architecture a dominant technology for integrated circuits.

The choice of power supply ($V_{CC}$) and threshold voltage ($V_T$) may be important in determining whether the performance of deep sub-micron (e.g. 0.1 μm) transistors may continue to be scaled. However, lower transistor threshold voltages may lead to significant increases in leakage current due to the exponential nature of sub-threshold conductance. For example, about 80 to 90 mV reduction in the threshold voltage may result in about ten-fold increase in the leakage current. Higher leakage currents increase power dissipation that is undesirable for many semiconductor circuit applications. Higher leakage currents may be particularly problematic for mobile and handheld applications, for example.

One approach to addressing this issue has been to use a dual threshold voltage technique. In a dual threshold voltage approach, certain devices on an integrated circuit are configured to have a lower threshold voltage, while other devices on the same integrated circuit may be configured to have a higher threshold voltage. In this manner, devices that cannot tolerate the higher leakage current characteristic of lower threshold voltages may be selected to have higher threshold voltages. Typically only about 10 to 30% of the devices are performance critical and need this lower threshold voltage.

The leakage current reduction provided by this approach, however, is limited. This is because the lower threshold devices still exhibit the higher leakage current characteristic of such devices.

DESCRIPTION OF DRAWINGS

These and other features and advantages of the invention will become more apparent upon reading the following detailed description and upon reference to the accompanying drawings.

DETAILED DESCRIPTION

In recognition of the above-described difficulties with leakage current reduction using dual-threshold voltage technique, the present disclosure describes a method that utilizes transistor stack effect that trades off gate delay for leakage current.

FIGS. 1A through 1D illustrate a technique for reducing leakage current using a transistor stack effect. A similar technique has been described in U.S. Pat. No. 6,169,419 assigned to a common assignee as the present disclosure.

A transistor stack, as the term is used herein, refers to two or more series-coupled transistors of a same type (either n-type or p-type). For one embodiment, the transistor stack causes the stack effect by turning off at least two transistors of the same type coupled in series for each of the logic gates, to reduce leakage current during the standby mode.

Figure 1A:
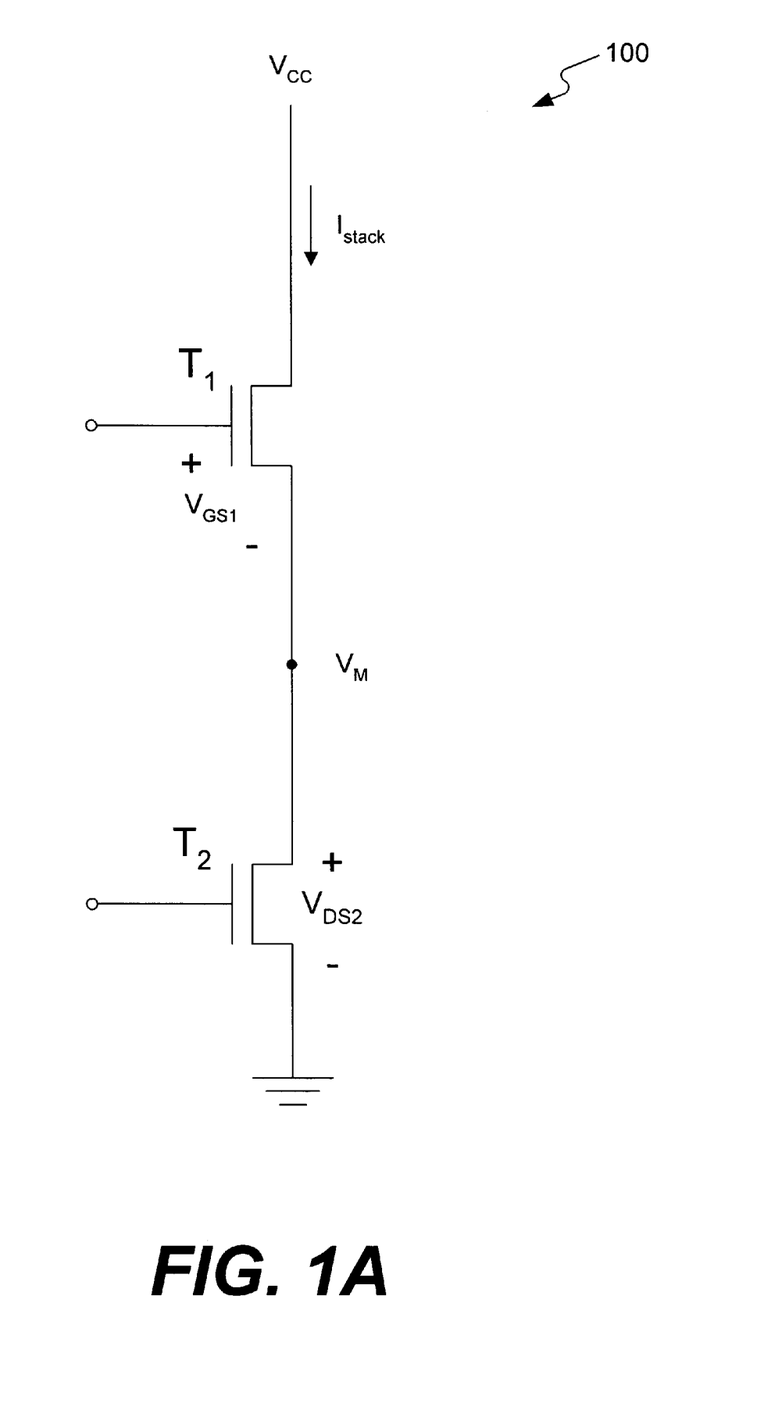
FIG. 1A is a schematic diagram of a transistor stack including two series-coupled n-type transistors.

FIG. 1A shows a schematic diagram of a transistor stack 100 including two series-coupled n-type transistors $T_1$, and $T_2$. When both $T_1$ and $T_2$ are turned off (i.e. when the voltage at both of their gates is logic low), the gate to source voltage ($V_{GS1}$) of $T_1$, is less than 0. Additionally, the bodies of the transistors $T_1$ and $T_2$ are tied to ground or another voltage. When both $T_1$ and $T_2$ are turned off, the threshold voltage of $T_1$ is increased due to the body effect. Turning $T_1$ and $T_2$ off also reduces the drain to source voltage $V_{DS2}$ of $T_2$, causing the threshold voltage of $T_2$ to increase as the voltage at the intermediate node $V_M$ converges to a very small value.

The above effects alone and/or in combination cause the leakage current through the transistor stack 100 to be approximately an order of magnitude smaller when both $T_1$ and $T_2$ are turned off, as compared to when only one of $T_1$ or $T_2$ is turned off. This result is referred to herein as the stack effect. For transistor stacks including more than two transistors of the same type coupled in series, an even larger reduction in leakage current due to the stack effect is possible where three or more stacked transistors are turned off at once. The stack effect results in similar advantages for two or more series-coupled p-type transistors that are turned off at the same time.

Figure 1B:
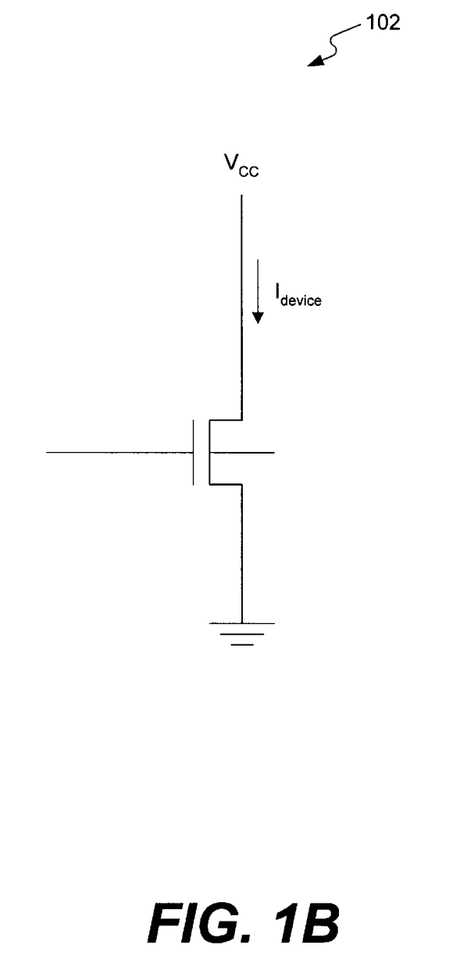
FIG. 1B shows a single transistor device having a device leakage current, $I_{device}$.

FIG. 1B shows a single transistor (e.g. an inverter) device 102 having a device leakage current, $I_{device}$. Characteristic of this device 102 may be illustrated as a curve 120 in FIG. 1D. Thus depending on the supply voltage, the device leakage current may be as high as point 124 shown in FIG. 1D.

Figure 1C:
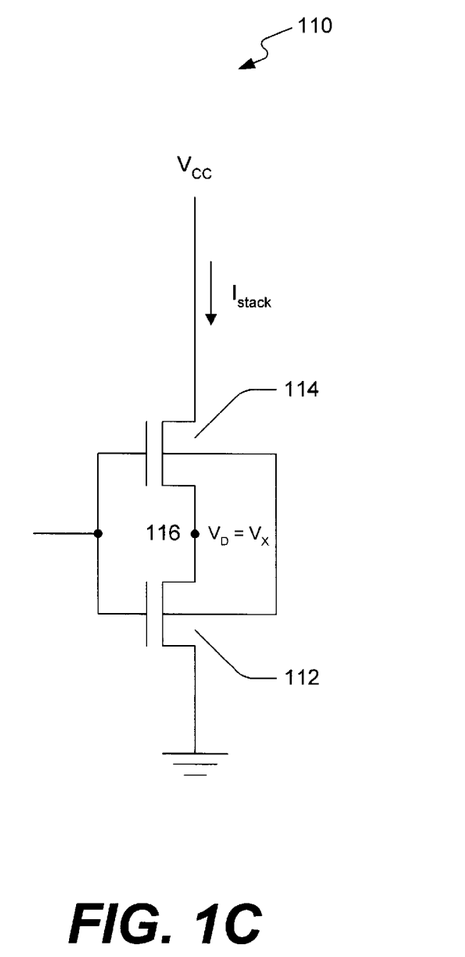
FIG. 1C shows a two-transistor device configured in a stacked configuration having a device leakage current, $I_{stack}$.
Figure 1D:
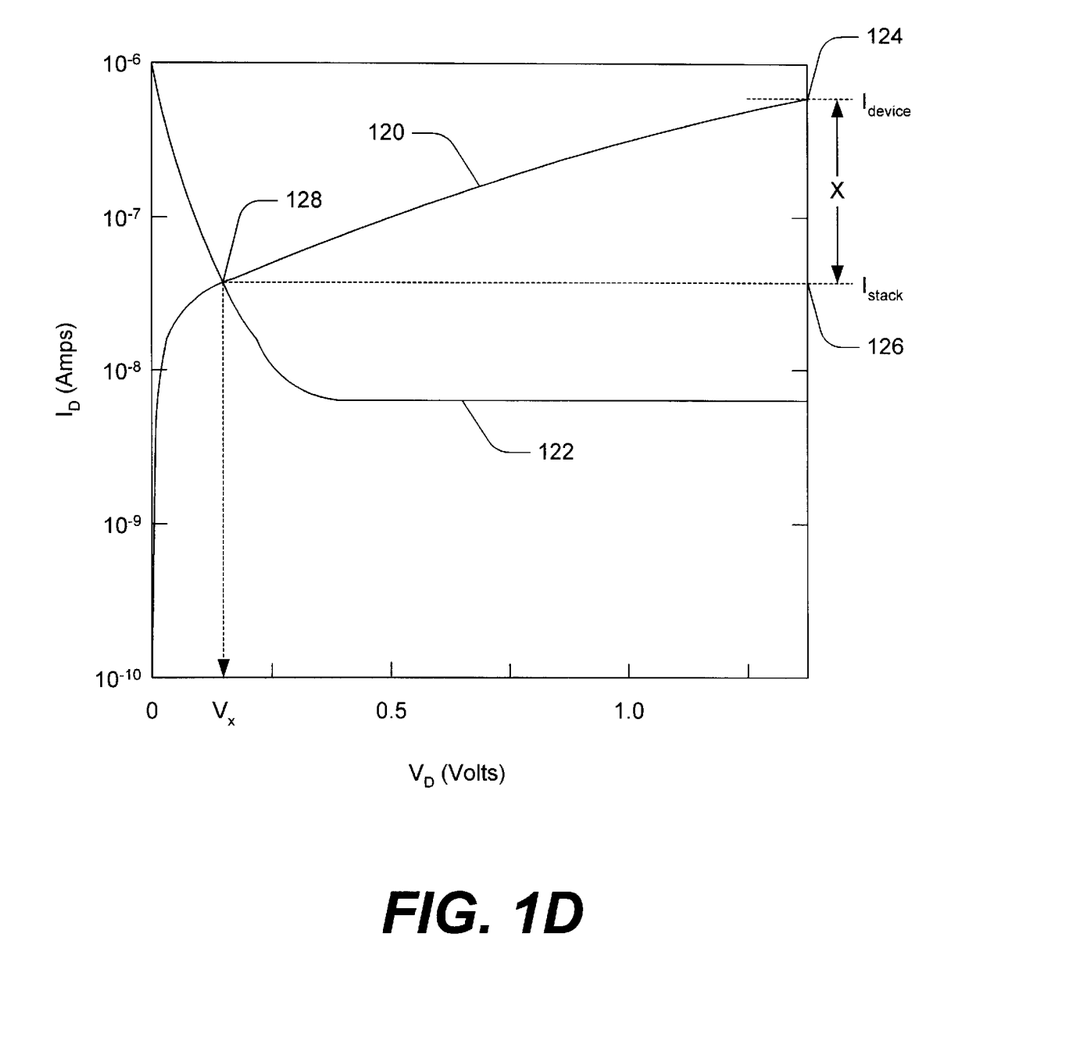
FIG. 1D plots characteristic of a stacked device plotted as a device voltage versus a device current.

FIG. 1C shows a two-transistor device 110 configured in a stacked configuration. The device 110 is adapted to take advantage of the stack effect to reduce the device leakage current. Thus, the characteristic of this device 110 plotted as a device voltage versus a device current is shown in FIG. 1D. The curve 120 may represent the device leakage current of the lower transistor 112 as a function of voltage, while the curve 122 may represent the device leakage current of the upper transistor 114. The point 128, where the two curves 120, 122 meet, represents voltage and current values of the device 110 at node 116 (see FIG. 1C). The device leakage current at this point 128 is indicated as $I_{stack}$ 126 in FIG. 1D. Thus, the device leakage current reduction derived from the stack effect may be represented as some value X (see FIG. 1D).

In a functional block, there are naturally stacked gates such as NAND, NOR, or other more complex gates. The naturally stacked gates are gates where the design constraints cause stacked transistors. Maximizing the number of natural stacks that are in OFF state may reduce the leakage current of such a functional block. If the stack leakage current reduction factor in a logic gate is 10, for example, then at a functional block level, overall leakage current reduction may be substantially less than 10. This is because not all natural stacks in the block may be forced to be in an OFF state.

Figure 2A:
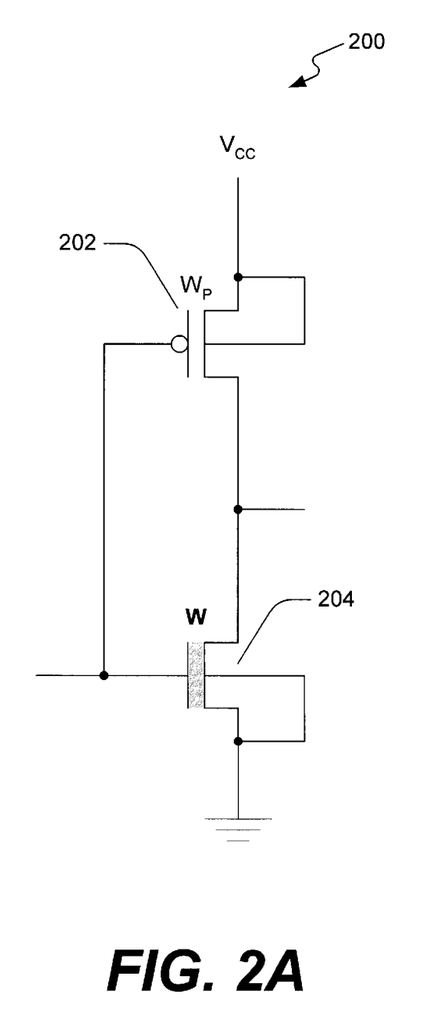
FIG. 2A shows an inverter without the stack effect.
Figure 2B:
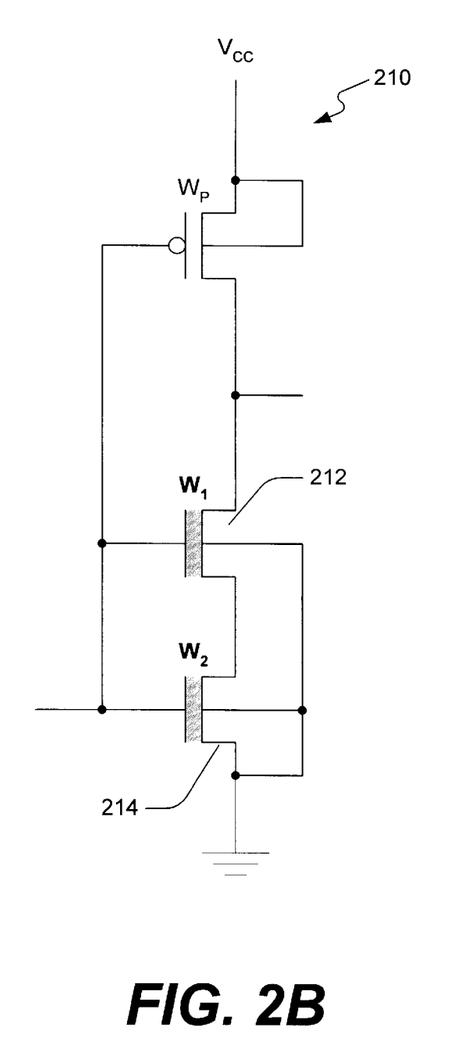
FIG. 2B shows an iso-input load stack inverter gate having two n-type transistors in a forced stack configuration.

To increase the leakage reduction potential, stacks may be forced for gates that do not naturally have stacks. An example is shown with an inverter design in FIGS. 2A and 2B. FIG. 2A shows the original inverter 200 without the stack effect. The inverter includes p-type transistor 202 with a device width of $W_p$ and an n-type transistor 204 with a device width of W. By modifying the lower n-type transistor 204 into an iso-input load stack inverter gate having two n-type transistors 212, 214, as shown in FIG. 2B, a stack effect may be forced by holding the input at logic low during standby mode. The term iso-input refers to tying the inputs of the two n-type transistors 212, 214 together. The choice between n-stack and p-stack forcing may be made depending on the input logic level. Thus, in the above example, two p-type transistors may be forced into a stack effect by holding the input at logic high during standby mode.

Under forced stack condition, as shown in FIG. 2B, the stack effect factor (X) may be derived as follows:

$$X \approx \frac{W}{W_1^\alpha W_2^{1-\alpha}} \cdot 10^{\frac{\lambda_d V_{CC}}{S}(1-\alpha)} \quad (1)$$

where $$\alpha \cong \frac{\lambda_d}{1+2\lambda_d},$$

$\lambda_d$ is a drain-induced barrier lowering (DIBL) factor, S is a sub-threshold slope, and $V_{CC}$ is the power supply voltage. Designations $W_1$ and $W_2$ represent device widths of the transistors 212 and 214, respectively. Moreover, under iso-input load conditions $W_1 + W_2 = W$. Further, minimum gate delay for the stacked inverter is provided when $$W_1 = W_2 = \frac{W}{2}.$$

Figure 3:
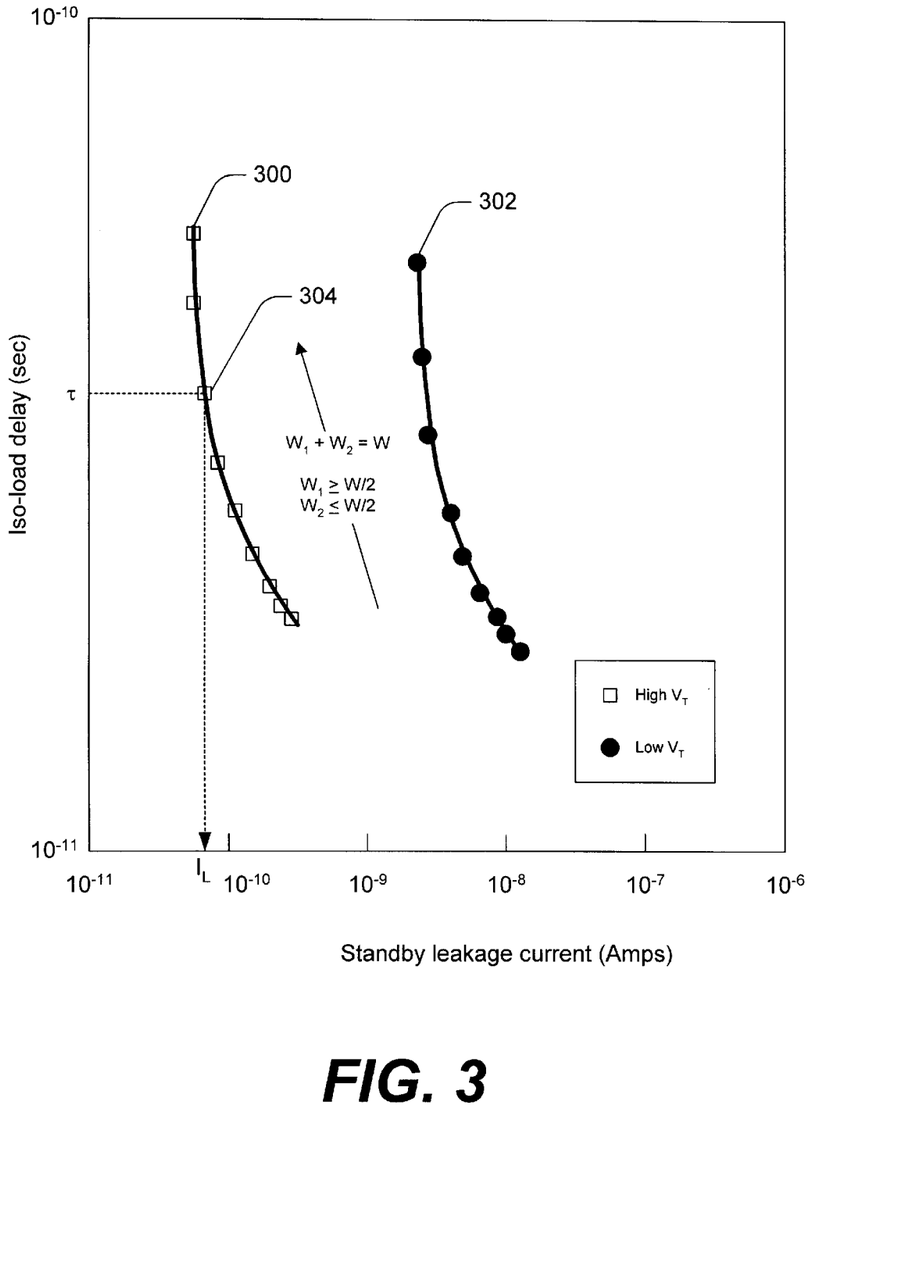
FIG. 3 plots a technique of trading off standby leakage current for its gate delay time according to an embodiment of the present disclosure.

Therefore, increasing the device width $W_1$ of the transistor 212, and decreasing the device width $W_2$ of the transistor 214, as shown in FIG. 3, may increase the stack effect.

FIG. 3 illustrates a technique of trading off standby leakage current of a device for its gate delay according to an embodiment. The figure also illustrates that this technique may be used in place of or in conjunction with a dual-threshold voltage configuration. FIG. 3 shows two curves 300, 302. Curve 302 represents the low threshold voltage. Curve 300 represents the high threshold voltage. The figure shows that by adjusting the device widths ($W_1$ and $W_2$) of the transistors 212, 214, along one of two curves 300, 302, the stacked inverter 210 may be designed to have a desired leakage current and gate delay.

For example, the stacked inverter 210 may be designed such that the device width $W_1$ is equal to 0.75*W and the device width $W_2$ is equal to 0.25*W. Assuming that the stacked inverter 210 is a high threshold voltage device, this design may be represented as a trade-off point 304 on the curve 300. This may provide a standby leakage current of $I^L = 9 \times 10^{-11}$ amps and a gate delay of $\tau = 5 \times 10^{-11}$ secs. Thus, this example illustrates the trade-off process of designing a stacked device by controlling the transistor widths. The same process may be used to design a device having both high and low threshold voltages.

Figure 4:
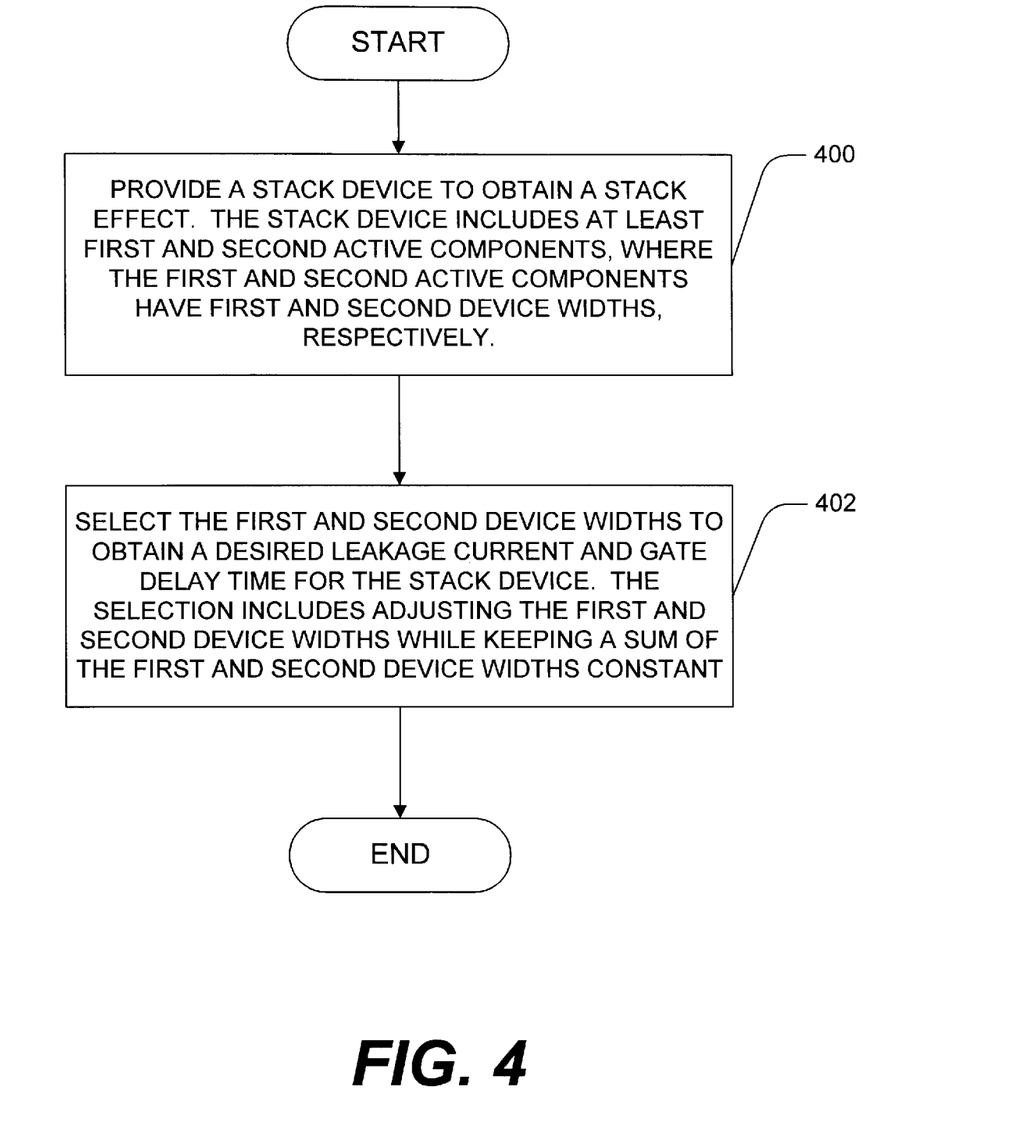
FIG. 4 is a flowchart for a technique of trading off standby leakage current for gate delay time.

FIG. 4 is a flowchart illustrating the technique of trading off standby leakage current for gate delay time. This technique may be executed on a processor, to execute instructions that automatically carry this out. The technique involves providing a stack device to obtain a stack effect, at 400. In one aspect, the stack device includes at least first and second active components that are series-coupled. A typical active component includes a transistor. The first active component has a first device width, and the second active component has a second device width. At 402, the first and second device widths are selected to obtain a desired leakage current and gate delay time for the stack device. The selection includes adjusting the first and second device widths while keeping a sum of the first and second device widths as a constant.

Figure 5:
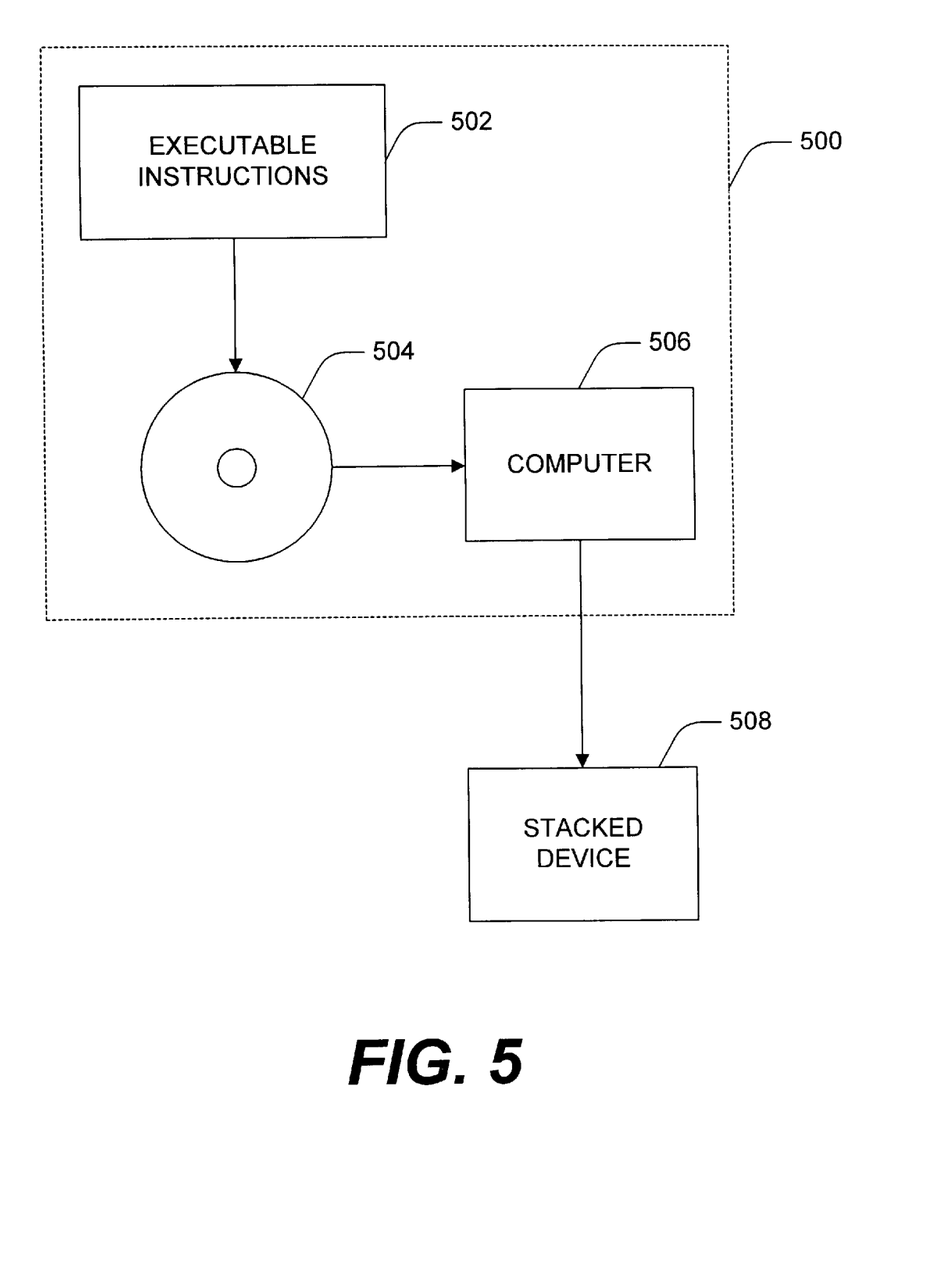
FIG. 5 shows an apparatus comprising a machine-readable storage medium having executable instructions.

FIG. 5 shows an apparatus 500 comprising a machine-readable storage medium 504 having executable instructions 502. The apparatus 500 also includes a processor 506 that executes the instructions 502 to trade off gate delay time for leakage current reduction in a stacked device 508.

While specific embodiments of the invention have been illustrated and described, other embodiments and variations are possible. For example, although the illustrated embodiments show an iso-input load stacked device, iso-input load is not a necessary condition. Nonetheless, by increasing the input load, active and leakage power may be traded off for performance. Further, even though the examples show only transistors being used in the stacked devices, other active components may be used in stacked configuration to reduce leakage current.

All these are intended to be encompassed by the following claims.

What is claimed is:

1. A method, comprising:

providing a stack device to obtain a stack effect, said stack device including at least first and second active components, where said at least first and second active components have first and second device widths, respectively; and selecting said first and second device widths to obtain a desired leakage current and gate delay time for the stack device, said selecting including adjusting said first and second device widths while keeping a sum of the first and second device widths constant.

2. The method of claim 1, wherein said first and second active components include first and second transistors, respectively.

3. The method of claim 1, wherein said selecting includes fixing each of the first and second device widths equal to one-half of the sum.

4. The method of claim 1, wherein said adjusting includes increasing the first device width to a value greater than one-half of the sum, and decreasing the second device width to a value less than one-half of the sum.

5. The method of claim 1, wherein said providing the stack device includes modifying a non-stack device into the stack device, such that a leakage current of the stack device is lower than a leakage current of the non-stack device by a fixed amount.

6. The method of claim 5, wherein said fixed amount is represented as $$X \approx \frac{W}{W_1^\alpha W_2^{1-\alpha}} \cdot 10^{\frac{\lambda_d V_{CC}}{S}(1-\alpha)},$$

where $$\alpha \cong \frac{\lambda_d}{1+2\lambda_d},$$

$\lambda_d$ is a drain-induced barrier lowering (DIBL) factor, S is a sub-threshold slope, and $V_{CC}$ is a power supply voltage of the stack device.

7. The method of claim 1, further comprising:
providing additional devices to allow dual threshold voltage control, where said stack device and said additional devices are adapted to operate with both a low threshold voltage and a high threshold voltage.

8. The method of claim 7, wherein said providing said additional devices includes appropriately adjusting device widths of said stack device and said additional devices over said low threshold voltage and said high threshold voltage.

9. A method for trading off gate delay time for leakage current reduction in a circuit, comprising:
modifying a non-stack device into a forced stack device to obtain a stack effect, said forced stack device including a plurality of active components, said plurality of active components having at least first and second transistors, where the first transistor has a first transistor width and the second transistor has a second transistor width, and keeping constant a sum of said first transistor width and said second transistor width; and
increasing the first transistor width to a value greater than one-half of the sum, and decreasing the second transistor width to a value less than one-half of the sum, to obtain desired leakage current and gate delay time for the circuit.

10. The method of claim 9, further comprising:
providing additional devices to allow dual threshold voltage control, where said forced stack device and said additional devices are configured to have low and high threshold voltages.

11. The method of claim 10, wherein said additional devices are stack devices.

12. An apparatus comprising a machine-readable storage medium having executable instructions which when executed by a processor trades off gate delay time for leakage current reduction in a circuit by:
providing a stack device to obtain a stack effect, said stack device including at least first and second active components, where said at least first and second active components have first and second device widths, respectively; and
selecting said first and second device widths to obtain a desired leakage current and gate delay time for the stack device, said selecting including adjusting said first and second device widths while keeping a sum of the first and second device widths constant.

13. The apparatus of claim 12, wherein said selecting includes fixing each of the first and second device widths equal to one-half of the sum.

14. The apparatus of claim 12, wherein said adjusting includes increasing the first device width to a value greater than one-half of the sum, and decreasing the second device width to a value less than one-half of the sum.

15. A stack device, comprising:
a first active component having a first device width; and
a second active component coupled to said first active component, said second active component having a second device width,
wherein said first and second device widths are selected to provide a desired leakage current and delay time for the stack device, and
wherein said first and second device widths are selected so that a sum of said first and second device widths is constant.

16. The device of claim 15, wherein said first and second device widths are substantially equal.

17. The device of claim 15, wherein said first and second device widths are adjustable.

18. The device of claim 17, wherein said first device width is adjusted to be a multiple of said second device width.

19. The device of claim 15, wherein said first and second active components are first and second transistors, respectively.

20. The device of claim 19, wherein said first and second transistors include channels doped with same type of dopants.

21. The device of claim 19, wherein bodies of said first and second transistors are coupled together.

22. The device of claim 21, wherein inputs of said first and second transistors are coupled together.

* * * * *